(12) United States Patent
Gagnon et al.

(10) Patent No.: US 7,166,807 B2
(45) Date of Patent: Jan. 23, 2007

(54) CURRENT SENSOR

(75) Inventors: Jay Gagnon, Holden, MA (US); Richard Dickinson, Manchester, NH (US); Michael C. Doogue, Manchester, NH (US); Andreas P. Friedrich, Epagny (FR); William P. Taylor, Amherst, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 11/144,970

(22) Filed: Jun. 3, 2005

(65) Prior Publication Data

US 2005/0224248 A1   Oct. 13, 2005

Related U.S. Application Data

(63) Continuation-in-part of application No. 11/140,250, filed on May 27, 2005, now Pat. No. 6,995,315, which is a continuation-in-part of application No. 10/649,450, filed on Aug. 26, 2003.

(51) Int. Cl.
*H01L 23/495* (2006.01)

(52) U.S. Cl. .............. 174/536; 324/117 H; 324/117 R; 324/251

(58) Field of Classification Search .............. 174/52.1, 174/52.3, 52.4, 536; 324/117 H, 117 R, 324/126, 127, 251, 252; 338/32 R, 32 H, 338/49

See application file for complete search history.

(56) References Cited

U.S. PATENT DOCUMENTS 4,893,073 A   1/1990   McDonald et al.

(Continued)

FOREIGN PATENT DOCUMENTS

EP   1 107 327 A2   6/2001

(Continued)

OTHER PUBLICATIONS

Mangtani et al.; "Current Sensor," U.S. Appl. No. 11/336,502, filed on Jan. 20, 2006.

(Continued)

*Primary Examiner*—Hung V. Ngo
(74) *Attorney, Agent, or Firm*—Daly, Crowley, Mofford & Durkee, LLP

(57) ABSTRACT

An integrated circuit current sensor includes a lead frame having at least two leads coupled to provide a current conductor portion, and substrate having a first surface in which is disposed one or more magnetic field transducers, with the first surface being proximate the current conductor portion and a second surface distal from the current conductor portion. In one particular embodiment, the substrate is disposed having the first surface of the substrate above the current conductor portion and the second surface of the substrate above the first surface. In this particular embodiment, the substrate is oriented upside-down in the integrated circuit relative to a conventional orientation. A current conductor portion can be deposited proximate to a surface of the substrate and proximate to the one or more magnetic field sensors. With this arrangement, a current sensor is provided for which the one or more magnetic field transducers are very close to the current conductor portion, resulting in a current sensor having improved sensitivity. An insulating layer can be disposed between the current conductor portion and the substrate.

29 Claims, 13 Drawing Sheets

U.S. PATENT DOCUMENTS

| | | | |
|---|---|---|---|
| 5,041,780 A | | 8/1991 | Rippel |
| 5,124,642 A | * | 6/1992 | Marx .................. 324/127 |
| 5,247,202 A | | 9/1993 | Popovic et al. |
| 5,615,075 A | * | 3/1997 | Kim ..................... 361/87 |
| 6,005,383 A | * | 12/1999 | Savary et al. .......... 324/117 H |
| 6,252,389 B1 | | 6/2001 | Baba et al. |
| 6,356,068 B1 | | 3/2002 | Steiner et al. |
| 6,462,531 B1 | | 10/2002 | Ohtsuka |
| 6,545,456 B1 | | 4/2003 | Radosevich et al. |
| 6,683,448 B1 | | 1/2004 | Ohtsuka |
| 6,727,683 B2 | | 4/2004 | Goto et al. |
| 6,995,315 B2 | | 2/2006 | Sharma et al. |
| 2004/0056647 A1 | | 3/2004 | Stauth et al. |
| 2004/0080308 A1 | | 4/2004 | Goto |
| 2004/0155644 A1 | | 8/2004 | Stauth et al. |
| 2005/0045359 A1 | | 3/2005 | Doogue et al. |
| 2006/0002147 A1 | | 1/2006 | Hong et al. |

FOREIGN PATENT DOCUMENTS

| | | |
|---|---|---|
| EP | 1 107 328 A2 | 6/2001 |
| EP | 1 111 693 A2 | 6/2001 |
| JP | 61-71649 | 4/1986 |
| JP | 4-364472 | 12/1992 |
| WO | WO 99/14605 | 3/1999 |

OTHER PUBLICATIONS

Taylor et al.; U.S. Appl. No. 11/129,933, filed on May 16, 2005.

PCT Search Report and Written Opinion of the ISA for PCT/US2004/009908 dated Aug. 16, 2004.

Steiner, et al.; "Fully Packaged CMOS Current Monitor Using Lead-on-Chip Technology;" Physical Electronics Laboratory, ETH Zurich, CH8093 Zurich, Switzerland; No. D-7803-4412-X/98; IEEE 1998; pp. 603-608.

Doogue et al.; "Current Sensor;" U.S. App. No. 11/140,250 filed on May 257 2005.

* cited by examiner

CURRENT SENSOR

CROSS-REFERENCE TO RELATED APPLICATIONS

This application is a Continuation-in-Part application of and claims the benefit under 35 U.S.C. §120 of U.S. application Ser. No. 11/140,250 filed on May 27, 2005, now U.S. Pat. No. 6,995,315 which is a Continuation-in-Part application of and claims the benefit under 35 U.S.C. §120 of U.S. application Ser. No. 10/649,450 filed on Aug. 26, 2003, which applications are incorporated herein by reference in their entirety.

STATEMENT REGARDING FEDERALLY SPONSORED RESEARCH

Not Applicable.

FIELD OF THE INVENTION

This invention relates generally to electrical current sensors, and more particularly to a miniaturized current sensor in an integrated circuit package.

BACKGROUND OF THE INVENTION

As is known in the art, one type of conventional current sensor uses a magnetic field transducer (for example a Hall effect or magnetoresistive transducer) in proximity to a current conductor. The magnetic field transducer generates an output signal having a magnitude proportional to the magnetic field induced by a current that flows through the current conductor.

Some typical Hall effect current sensors include a gapped toroid magnetic flux concentrator, with the Hall effect element positioned in the toroid gap. The Hall effect device and toroid are assembled into a housing, which is mountable on a printed circuit board. In use, a separate current conductor, such as a wire, is passed through the center of the toroid. Such devices tend to be undesirably large, both in terms of height and circuit board area.

Other Hall effect current sensors include a Hall effect element mounted on a dielectric material, for example a circuit board. One such current sensor is described in a European Patent Application No. EP0867725. Still other Hall effect current sensors include a Hall effect element mounted on a substrate, for example a silicon substrate as described in a European Patent Application No. EP1111693.

Various parameters characterize the performance of current sensors, including sensitivity and linearity. Sensitivity is related to the magnitude of a change in output voltage from the Hall effect transducer in response to a sensed current. Linearity is related to the degree to which the output voltage from the Hall effect transducer varies in direct proportion to the sensed current.

The sensitivity of a current sensor is related to a variety of factors. One important factor is the flux concentration of the magnetic field generated in the vicinity of the current conductor and sensed by the Hall effect element. For this reason, some current sensors use a flux concentrator. Another important factor, in particular for a current sensor in which a flux concentrator is not used, is the physical separation between the Hall effect element and the current conductor.

SUMMARY OF THE INVENTION

In accordance with the present invention a method of manufacturing an integrated circuit includes providing a magnetic field sensing element on a major surface of a substrate and mounting the substrate proximate to a lead frame. At least a portion of the lead frame is substantially parallel to the major surface of the substrate and proximate to the magnetic field sensing element. The lead frame has a plurality of leads and the portion of the lead frame proximate to the magnetic field sensing element comprises a current conductor portion including a coupling of at least two of the plurality of leads. The method further includes providing an insulating layer disposed between and proximate to the substrate and the portion of the lead frame, wherein the providing an insulating layer includes at least one of providing an interposing insulating layer, providing a lead frame insulating layer associated with the lead frame, and providing a substrate insulating layer associated with the substrate.

In accordance with another aspect of the present invention, an integrated circuit includes a lead frame having a plurality of leads and having a current conductor portion comprising a coupling of at least two of the plurality of leads. The integrated circuit also includes a substrate having first and second opposing surfaces. The first surface of the substrate is proximate to the current conductor portion and the second surface of the substrate is distal from the current conductor portion. The substrate is disposed having the first surface of the substrate above the current conductor portion and the second surface of the substrate above the first surface when the leads are in electrical contact with an uppermost surface of a circuit board. The integrated circuit also includes an insulating layer disposed between the substrate and the current conductor portion of the lead frame, and one or more magnetic field transducers disposed on the first surface of the substrate.

In accordance with yet another aspect of the present invention an integrated circuit includes a lead frame portion having a plurality of leads and having a first current conductor portion comprising at least two of the plurality of leads. The integrated circuit also includes a substrate having first and second opposing surfaces. The first surface of the substrate is proximate to the first current conductor portion and the second surface of the substrate is distal from the first current conductor portion. The integrated circuit also includes one or more magnetic field transducers disposed on the first surface of the substrate. The integrated circuit still further includes a second current conductor portion deposited proximate to the first surface of the substrate and disposed proximate to the one or more magnetic field transducers. The second current conductor portion is coupled to the first current conductor portion. The integrated circuit still further includes an insulating layer disposed between the second current conductor portion and the first surface of the substrate.

BRIEF DESCRIPTION OF THE DRAWINGS

The foregoing features of the invention, as well as the invention itself may be more fully understood from the following detailed description of the drawings, in which:

FIG. 9A is a cross-sectional view of an alternate embodiment of the current conductor portion of FIG. 9;

DETAILED DESCRIPTION OF THE INVENTION

Figure 1:
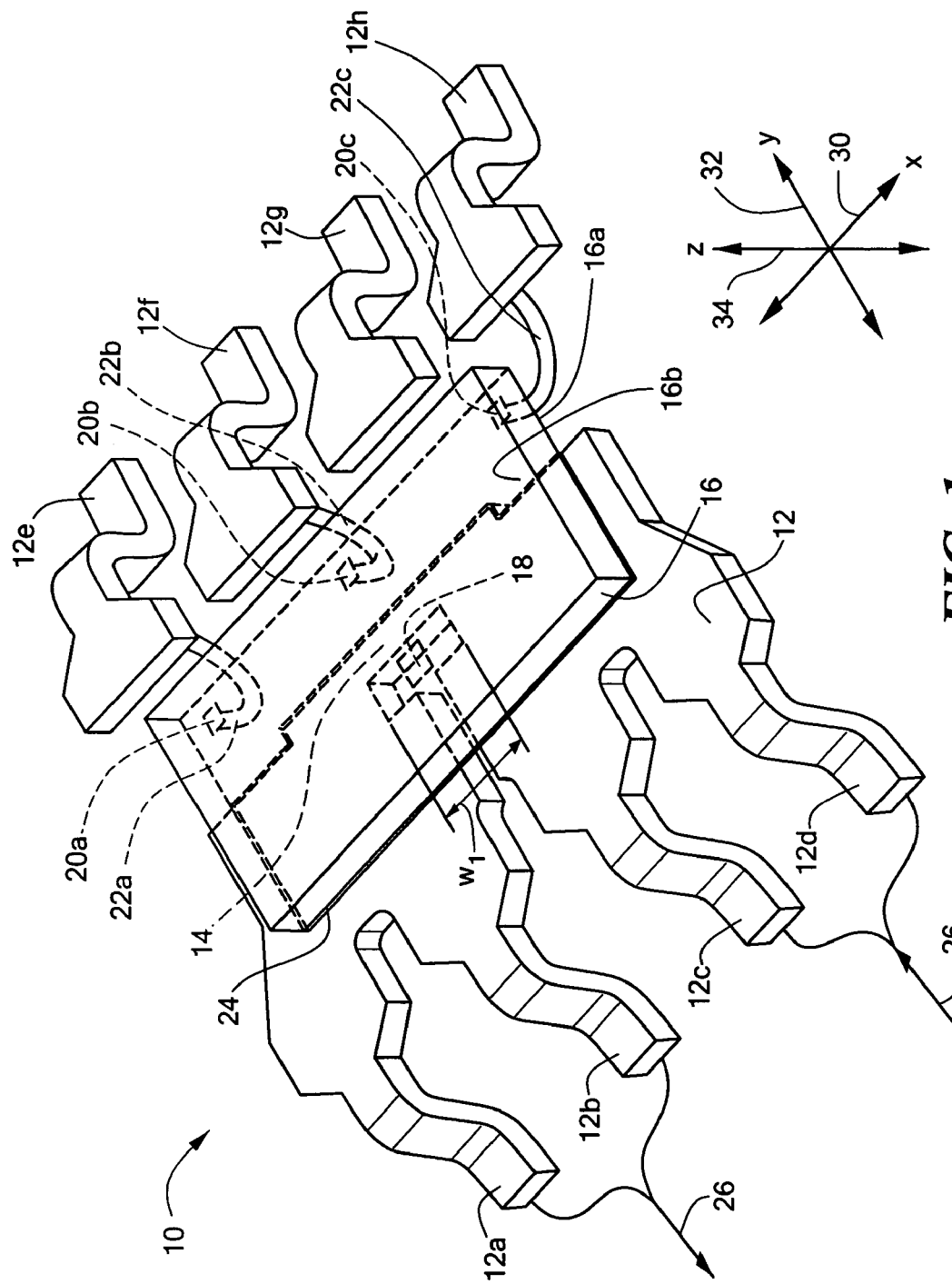
FIG. 1 is an isometric view of a current sensor in accordance with the present invention.

Referring to FIG. 1, an exemplary current sensor 10 in accordance with the present invention includes a lead frame 12 having a plurality of leads 12a–12h. The leads 12a and 12b are coupled to the leads 12c and 12d to form a current path, or current conductor with a narrow portion 14 having a width w1. The current sensor 10 also includes a substrate 16 having a first surface 16a and a second, opposing surface 16b. The substrate 16 has a magnetic field transducer 18 which, in some embodiments, can be a Hall effect element 18, diffused into the first surface 16a, or otherwise disposed on the first surface 16a. The substrate 16 can be comprised of a semiconductor material, e.g., silicon, or, in an alternate embodiment, the substrate 16 can be comprised of an insulating material.

The substrate 16 is disposed above the lead frame 12 so that the first surface 16a is proximate to the current conductor portion 14 and the second surface 16b is distal from the current conductor portion 14 and more specifically, so that the Hall effect element 18 is in close proximity to the current conductor portion 14. In the illustrated embodiment, the substrate 16 has an orientation that is upside down (i.e., the first surface 16a is directed downward) relative to a conventional orientation with which a substrate is mounted in an integrated circuit package.

The substrate 16 has bonding pads 20a–20c on the first surface 16a, to which bond wires 22a–22c are coupled. The bond wires are further coupled to the leads 12e, 12f, 12h of the lead frame 12.

An insulator 24 separates the substrate 16 from the lead frame 12. The insulator 24 can be provided in a variety of ways. For example, in one embodiment, a first portion of the insulator 24 includes a four μm thick layer of a BCB resin material deposited directly on the first surface 16a of the substrate 16. A second portion of the insulator 24 includes a layer of Staychip™ NUF-2071 E underfill material (Cookson Electronics Equipment, New Jersey) deposited on the leadframe 12. Such an arrangement provides more than one thousand volts of isolation between the substrate 16 and the leadframe 12.

It will be understood that the current conductor portion 14 is but a part of the total path through which an electrical current flows. For example, a current having a direction depicted by arrows 26 flows into the leads 12c, 12d, which are here shown to be electrically coupled in parallel, through the current conductor portion 14, and out of the leads 12a, 12b, which are also shown here to be electrically coupled in parallel.

With this arrangement, the Hall effect element 18 is disposed in close proximity to the current conductor portion 14 and at a predetermined position relative to the conductor portion 14, such that a magnetic field generated by an electrical current passing though the current conductor portion 14, in a direction shown by arrows 26, is in a direction substantially aligned with a maximum response axis of the Hall effect element 18. The Hall effect element 18 generates a voltage output proportional to the magnetic field and therefore proportional to the current flowing through the current conductor portion 14. The illustrated Hall effect element 18 has a maximum response axis substantially aligned with a z-axis 34. Because the magnetic field generated in response to the current is circular about the current conductor portion 14, the Hall effect element 18 is disposed just to the side (i.e., slightly offset along a y-axis 32) of the current conductor portion 14, as shown, where the magnetic field is pointed substantially along the z-axis 34. This position results in a greater voltage output from the Hall effect element 18, and therefore improved sensitivity. However, a Hall effect element, or another type of magnetic field sensor, for example a magnetoresistance element, having maximum response axis aligned in another direction, can be disposed at another position relative to the current conductor portion 14, for example, on top of the current conductor portion 14 (in a direction along z-axis 34).

Figure 3:
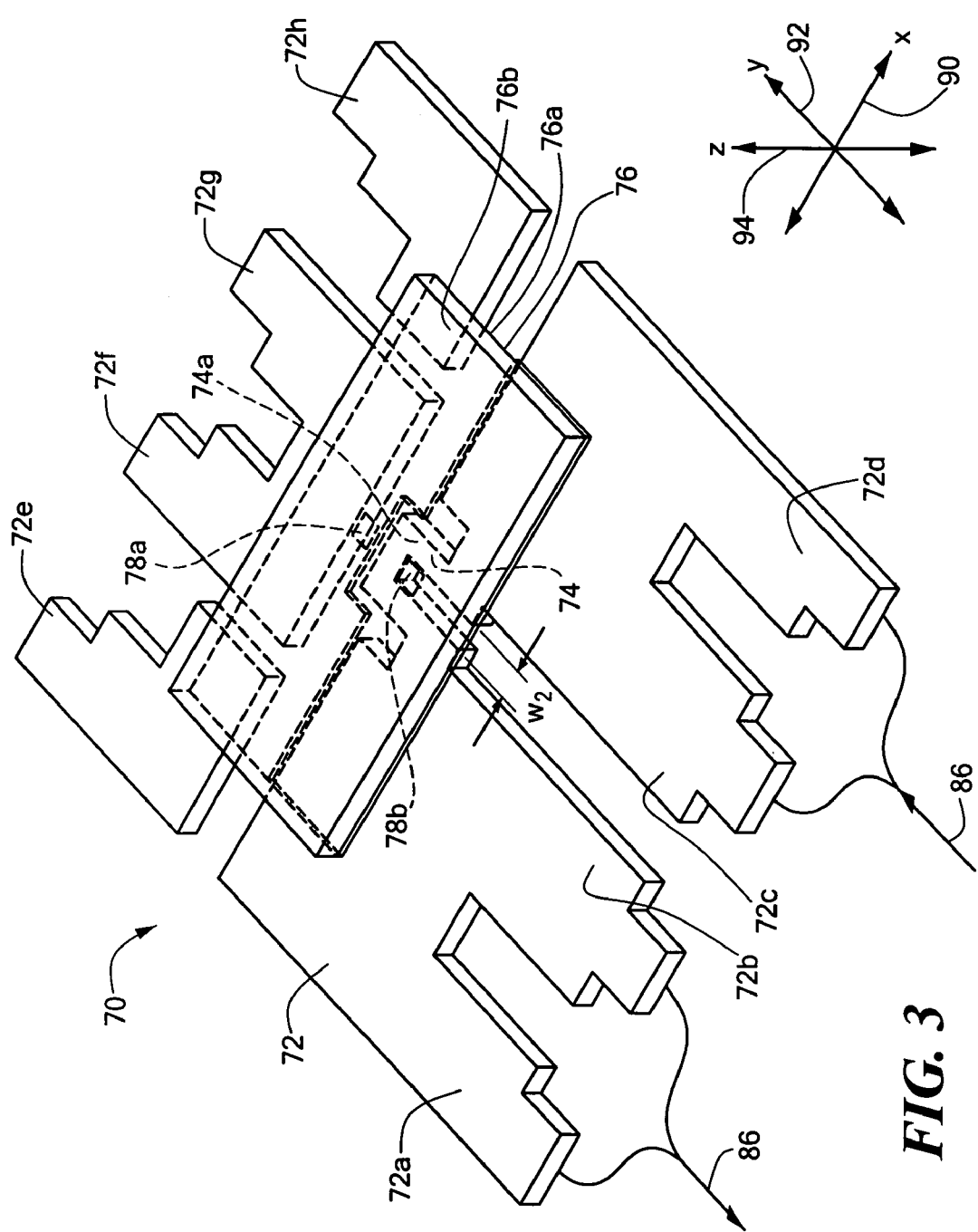
FIG. 3 is an isometric view of another embodiment of a current sensor in accordance with the present invention.
Figure 4:
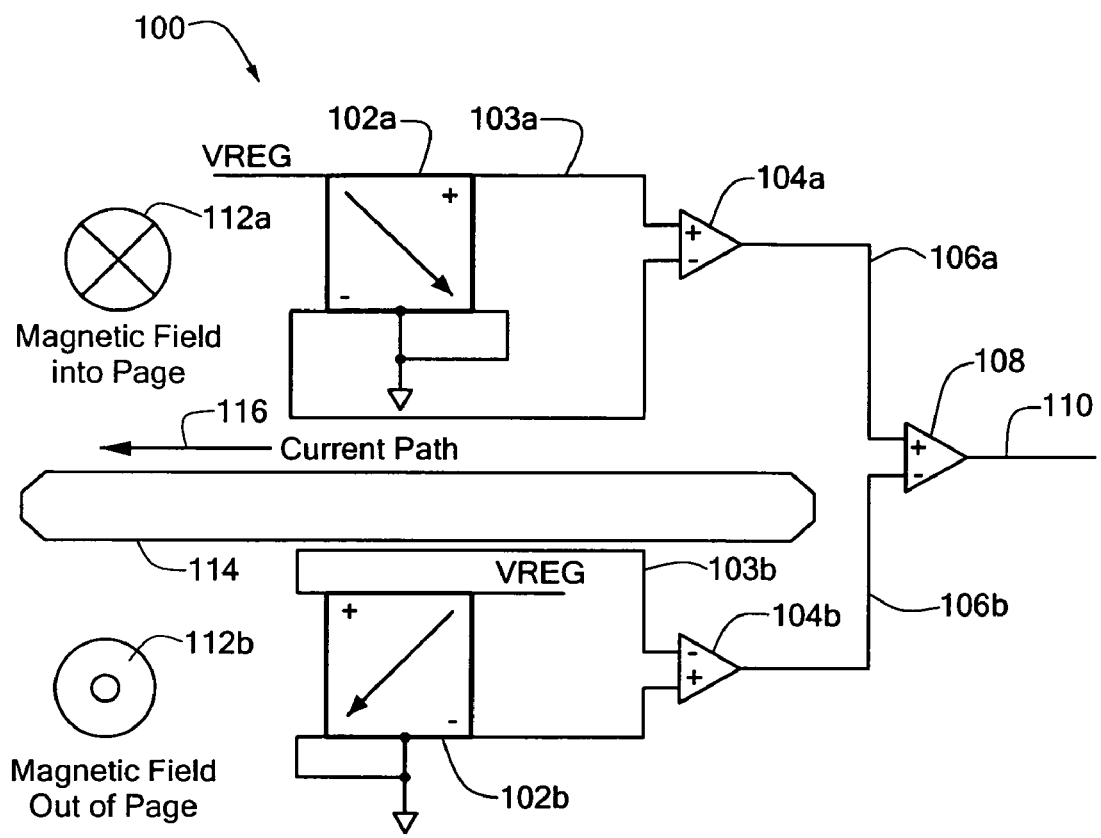
FIG. 4 is a schematic of a circuit forming part of the current sensor of FIG. 3.
Figure 5:
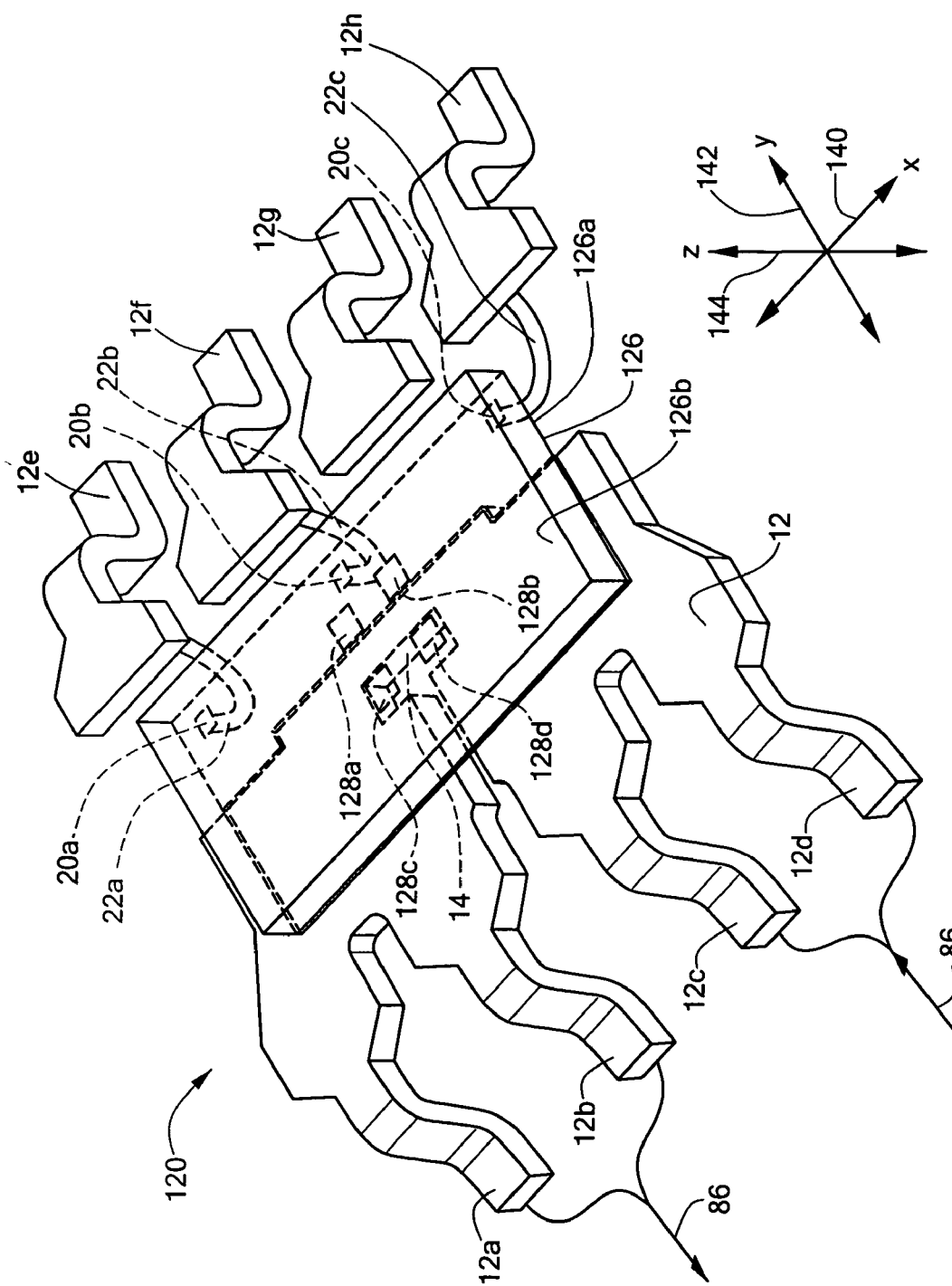
FIG. 5 is an isometric view of yet another embodiment of a current sensor in accordance with the present invention.

While one Hall effect element 18 is shown on the first surface 16a of the substrate 16, it will be appreciated that more than one Hall effect element can be used, as shown in the embodiments of FIGS. 3 and 5. Also, additional circuitry, for example an amplifier, can also be diffused in or otherwise disposed on, or supported by the first and/or second surfaces 16a, 16b of the substrate 16. Exemplary circuitry of this type is shown in FIG. 4.

Figure 7:
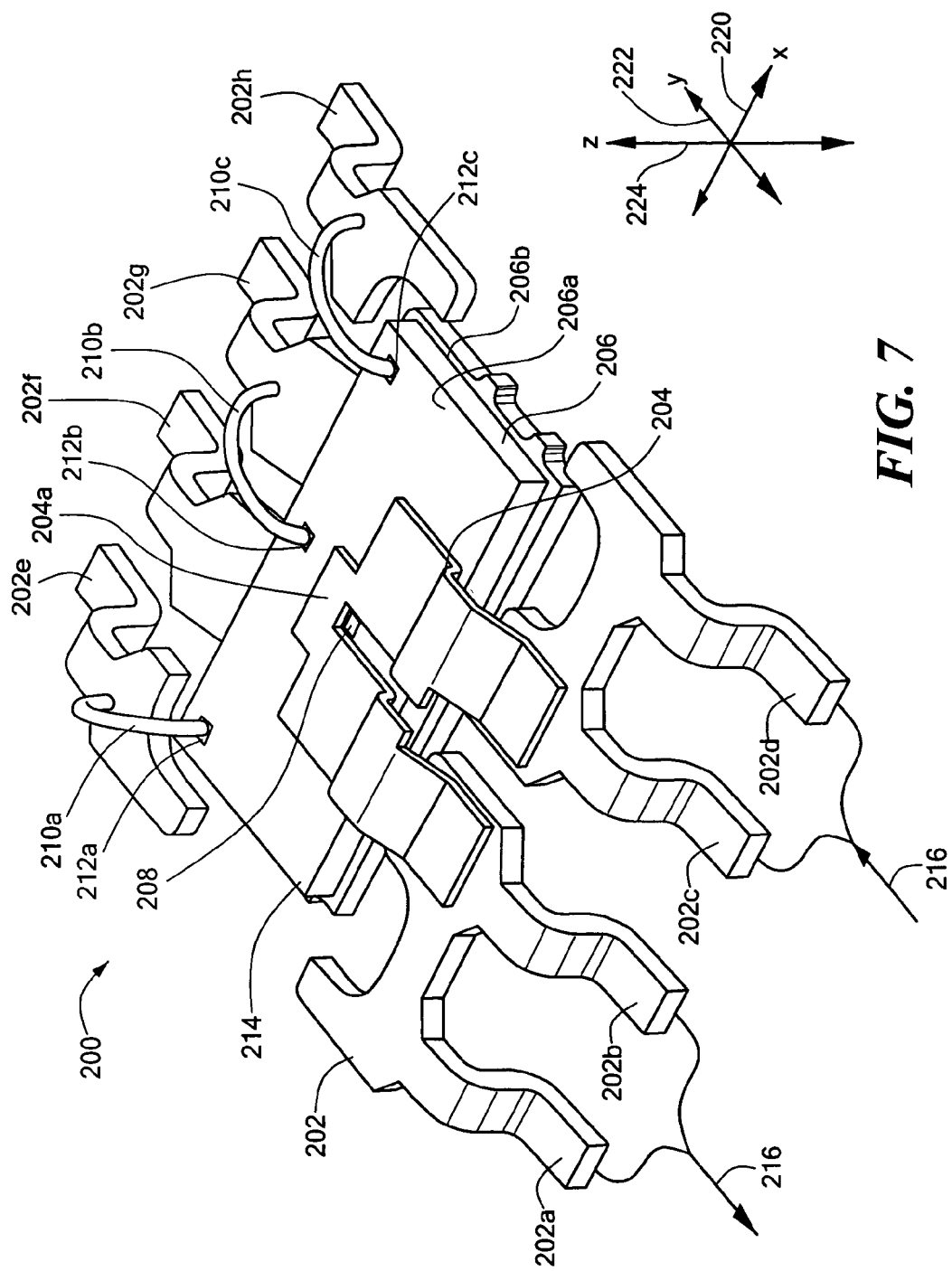
FIG. 7 is an isometric view of still another embodiment of a current sensor in accordance with the present invention.
Figure 8:
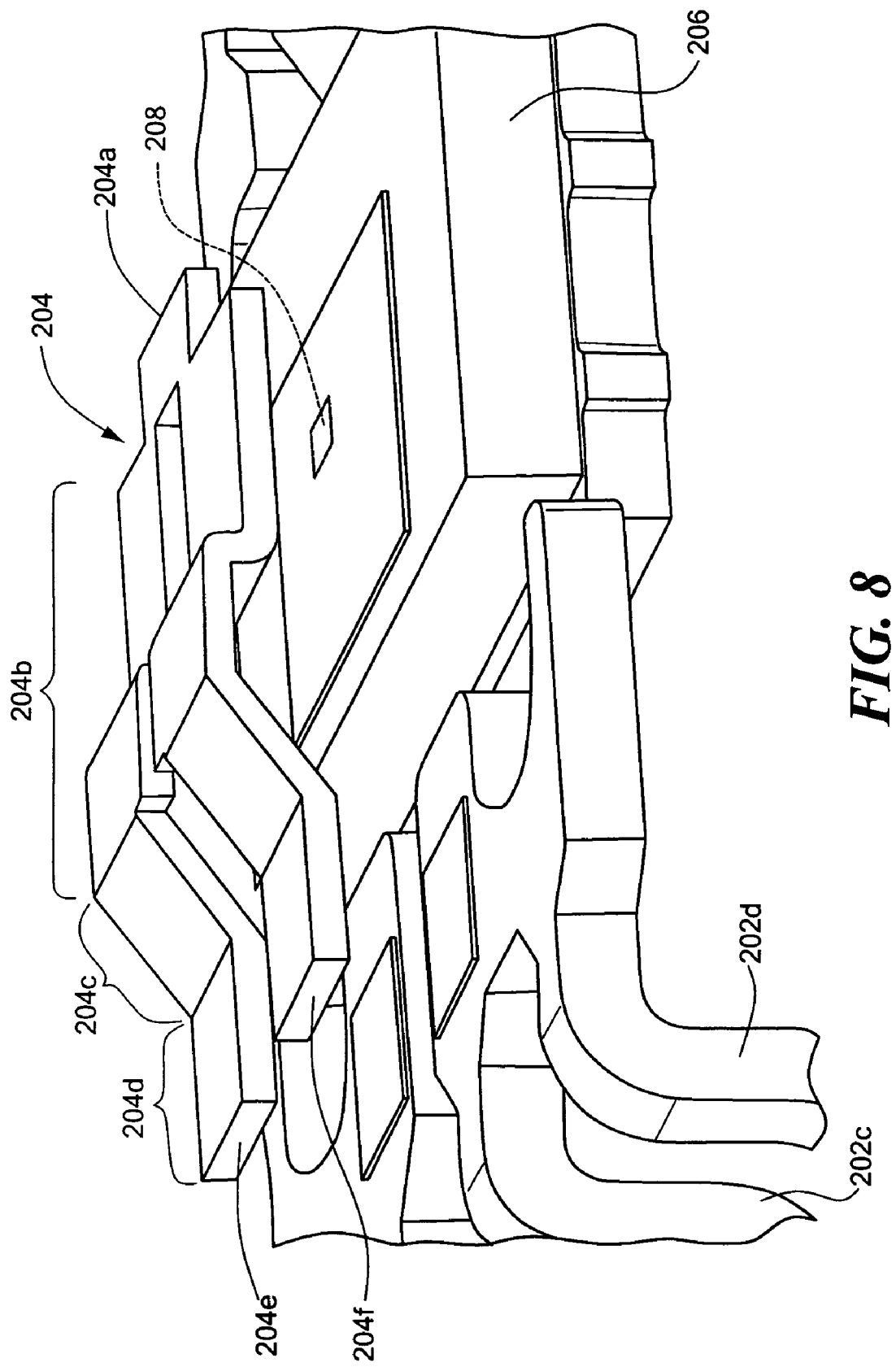
FIG. 8 is a further isometric view of the current sensor of FIG. 7.

In the embodiment of FIG. 1, the close proximity between the Hall effect element 18 and the current conductor 14 is achieved by providing the Hall effect element 18 on the first substrate surface 16a, which is positioned closer to the current conductor portion 14 than the second surface. In other embodiments, this advantageous close proximity is achieved by providing the Hall effect element 18 on the second substrate surface 16b and forming the current conductor portion 14 so as to be in substantial alignment with the second surface 16b, as shown in FIGS. 7 and 8.

Figure 2:
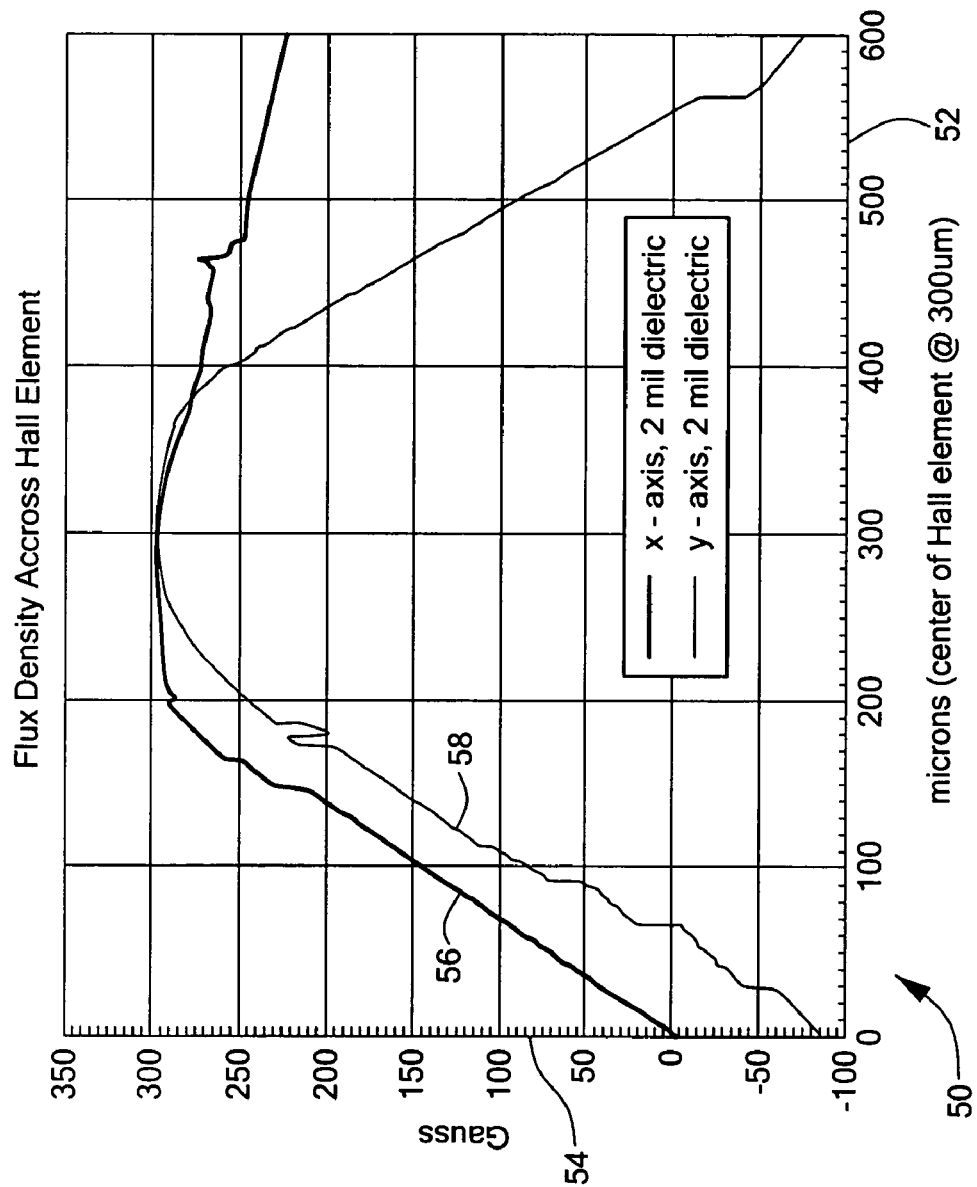
FIG. 2 is a graph showing a relationship between position across a Hall effect element of the current sensor of FIG. 1 and magnetic field.

Referring now to FIG. 2, a graph 50 illustrates the magnetic flux density in the direction of the z-axis 34 (FIG. 1) across the Hall element 18, along an x-axis 30 (FIG. 1) and the y-axis 32 (FIG. 1) in the plane of the Hall effect element 18 (FIG. 1), for a current through current conductor portion 14 on the order of 10 A. A center (not shown) of the Hall effect element 18 corresponds to three hundred microns on an abscissa 52. A mantissa 54 corresponds to magnetic flux.

A magnetic flux curve 56 corresponds to the change in magnetic flux in the z-axis 34 relative to position along the x-axis 30. Magnetic flux curve 58 corresponds to the change in magnetic flux in the z-axis 34 relative to position along the y-axis 32.

The magnetic flux curves 56, 58 can be characterized as being substantially flat in the vicinity of the Hall element, which is centered at 300 µm. Therefore, the output of the Hall effect element 18, which is sensitive to magnetic fields in the direction of the z-axis 34, is relatively insensitive to the position of the Hall effect element 18 along the x-axis 30 and along the y-axis 32.

An illustrative Hall effect element 18 has dimensions along the x-axis 30 and along the y-axis 32 on the order of 200 microns and therefore the Hall effect element 18 lies in a region between 200 microns and 400 microns on the abscissa 52. A change of position of the Hall effect element 18 by 50 microns either along the x-axis 30 or along the y-axis 32 results in little change in the magnetic field sensed by the Hall effect element. Therefore, the position of the Hall effect element in the x-axis 30 and the y-axis 32 can vary with manufacturing position tolerances without substantial effect upon the sensitivity of the current sensor 10 (FIG. 1).

The width w1 (FIG. 1) of the current conductor portion 14 in the x-direction 30 relative to the dimension of the Hall effect element 18 in the x-direction 30 significantly affects the uniformity of the flux density in the z-direction 34 with position along the Hall effect element 18 in the x-direction 30. In particular, the longer the current conductor portion 14 (i.e., the greater the width w1, FIG. 1), relative to the width of the Hall effect element 18 in the x-direction 30, the longer the curve 56 remains substantially flat.

The width w1 (FIG. 1) is selected in accordance with a variety of factors, including, but not limited to a desired sensitivity of the current sensor 10 (FIG. 1), and a desired reduction of performance variation resulting from manufacturing variation in relative position of the current path 14 and the Hall effect element 18. In general, it will be appreciated that selecting the width w1 to be comparable to a width of the Hall effect element 18, provides the greatest sensitivity of the current sensor 10. However, it will also be appreciated that selecting the width w1 to be greater than the width of the Hall effect element 18 provides the smallest performance variation resulting from manufacturing tolerance of Hall element positional placement in the x-direction 30.

Referring now to FIG. 3, another exemplary current sensor 70 in accordance with the present invention includes a lead frame 72 having a plurality of leads 72a–72h and a current conductor portion 74 having a width w2. The current sensor also includes a substrate 76 having a first surface 76a and a second, opposing surface 76b. The substrate 76 has first and second Hall effect elements 78a, 78b diffused into the first surface 76a, or otherwise disposed on or supported by the first surface 76a. The substrate 76 is disposed on the lead frame 72 so that the Hall effect element 78 is in close proximity to the current conductor portion 74. In the illustrated embodiment, the substrate 76 has an orientation that is upside down (i.e., the first surface 76a is directed downward) in relation to the conventional orientation of a substrate mounted in an integrated circuit package. An insulator (not shown) can separate the substrate 76 from the lead frame 72. The insulator can be the same as or similar to the insulator 24 shown in FIG. 1.

With this arrangement, both of the Hall effect elements 78a, 78b are disposed in close proximity to the current conductor portion 74 and at predetermined positions relative to the current conductor portion 74 such that a magnetic field generated by an electrical current passing though the current conductor portion 74 in a direction shown by arrows 86, is in a direction substantially aligned with a maximum response axis of the Hall effect elements 78a, 78b. Here, the Hall effect elements 78a, 78b each have a maximum response axis aligned with a z-axis 94. Therefore, the Hall effect elements 78a, 78b are disposed on opposite sides (i.e., slightly offset along a y-axis 92) of the current conductor portion 74, as shown, where the magnetic field is pointed along the z-axis 94. In one embodiment, the Hall effect elements 78a, 78b are offset (along the y-axis 92) by substantially equal and opposite amounts about the current conductor portion 74. However, Hall effect elements, or another type of magnetic field sensors, for example magnetoresistance elements, having maximum response axes aligned in another direction, can be disposed at other positions relative to the current conductor portion 74, for example, on top (in a direction of the z-axis 94) of the current conductor portion 74.

In operation, current flows into the leads 72c, 72d, which are coupled in parallel, through the current conductor portion 74, and out of the leads 72a, 72b, which are also coupled in parallel. The current flowing though the current conductor portion 74 generates a magnetic field which is sensed by the Hall effect elements 78a, 78b. As described above, the Hall effect elements 78a, 78b are in very close proximity to the current conductor portion 74 and at a predetermined position relative to the current conductor portion 74 for which the magnetic field generated by the current is substantially aligned with the maximum response axis of the Hall effect elements 78a, 78b. This placement results in a greater voltage output from the Hall effect elements 78a, 78b, and therefore improved sensitivity.

It will be appreciated that the magnetic fields experienced by the first and the second Hall effect elements 78a, 78b are oriented in opposite directions, each aligned along the z-axis 94. Therefore, if polarized in the same direction, the outputs of the two Hall effect elements 78a, 78b will be opposite in polarity. If the output from one of the Hall effect elements 78a, 78b is inverted, for example with an inverting amplifier, and then summed, i.e., differentially summed, with the output of the other of the Hall effect elements 78a, 78b, certain advantages are achieved.

As an initial advantage, the outputs of two Hall effect elements 78a, 78b, when differentially summed as described above, provide a voltage output of twice the magnitude of the voltage output from a single Hall effect element in the presence of the same current. Therefore, the current sensor 70 has twice the sensitivity of the current sensor 10 of FIG. 1.

As a second advantage, the current sensor 70 is relatively insensitive to variation in the position of the Hall effect elements 78a, 78b in the direction of the y-axis 92. This is because, when moved in the direction of the y-axis 92, the voltage output from one of the Hall effect elements 78a, 78b tends to increase while the voltage output from the other of the Hall effect elements 78a, 78b tends to decrease. Therefore, the differential sum of the two outputs remains relatively invariant.

While the lead frame 72 is shown to have the flat leads 72a–72h suitable for surface mounting to a circuit board, it will be appreciated that a lead frame having bent leads, like the lead frame 12 of FIG. 1, can also be used. Also, while two Hall effect elements 78a, 78b are shown, more than two or fewer than two Hall effect elements can also be used.

Referring now to FIG. 4, a summing circuit 100 suitable for performing the differential signal summation described in conjunction with FIG. 3 is shown coupled to two Hall effect elements 102a, 102b. The Hall effect elements 102a, 102b can be the same as or similar to the Hall effect elements 78a, 78b of FIG. 3. Here, each of the Hall effect elements 102a, 102b is rotated relative to the other Hall effect element by 90 degrees, as indicated by vectors on the Hall effect elements 102a, 102b. Therefore, in response to opposite magnetic fields 112a, 112b the Hall effect elements 102a, 102b generate output voltages 103a, 103b having the same polarities. The output voltage 103a is coupled to amplifier 104a arranged in a non-inverting configuration and the output voltage 103b is coupled to the amplifier 104b arranged in an inverting configuration. Therefore, the amplifier output voltages 106a, 106b move in opposite voltage directions in response to the magnetic fields 112a, 112b. The amplifier output voltages 106a, 106b are differentially coupled to an amplifier 108 to generate a differential summation, or a difference of the output voltages 106a, 106b. Therefore, the output voltages 106a, 106b differentially sum to provide a greater output voltage 110 at the output of amplifier 108.

The summing circuit 100 can be used in the current sensor 70 of FIG. 3, in which case Hall effect elements 102a, 102b correspond to the Hall effect elements 78a, 78b. In one particular embodiment, the summing circuit 100 is diffused into, or otherwise disposed upon, the first surface 76a of the substrate 76. In another embodiment, the summing circuit 100 is diffused into, or otherwise disposed upon, the second surface 76b of the substrate 76, while the Hall effect elements 78a, 78b remain on the first surface 76a, coupled to the other circuit components though vias or the like.

Referring now to FIG. 5, in which like elements of FIG. 1 are shown having like reference designations, another exemplary current sensor 120 includes a substrate 126 having a first surface 126a and a second, opposing surface 126b. Here, four Hall effect elements 128a–128d are diffused into or otherwise disposed on the first surface 126a of the substrate 126. The substrate 126 is positioned relative to the lead frame 12 such that first and second Hall effect element 128a, 128b respectively are on one side of the current conductor portion 14 along a y-axis 142, and third and fourth Hall effect elements 128c, 128d are on the opposite side of the current conductor portion 14 along the y-axis 42, as shown. In one embodiment, the Hall effect elements 128a, 128b are offset (along the y-axis 142) from the current conductor portion 14 by an amount equal to and opposite from the amount that the Hall effect elements 128c, 128d are offset (along the y-axis 142) from the current conductor portion 14.

With this arrangement, the Hall effect elements 128a–128d are disposed in close proximity to the current conductor portion 14 and at predetermined positions relative to the conductor portion 14, such that a magnetic field generated by an electrical current passing though the current conductor portion 14 in a direction shown by arrows 86, is in a direction substantially aligned with a maximum response axis of the Hall effect elements 128a–128d.

Here, each of the Hall effect elements 128a–128d has a maximum response axis aligned with a z-axis 144. In the illustrated embodiment, the Hall effect elements 128a, 128b are disposed on an opposite side (i.e., slightly offset along a y-axis 142) of the current conductor portion 144 than the Hall effect elements 128c, 128d, as shown, where the magnetic field is pointed along the z-axis 144. However, Hall effect elements, or another type of magnetic field sensors, for example magnetoresistance elements, having maximum response axes aligned in another direction, can be disposed at other positions relative to the current conductor portion 14, for example, on top (in a direction of the z-axis 144) of the current conductor portion 14. It will be appreciated that the first and second Hall effect elements 128a, 128b are exposed to a magnetic field in a direction along the z-axis 144 and the third and forth Hall effect elements 128c, 128d are exposed to a magnetic field in the opposite direction along the z-axis 144.

The four Hall effect elements 128a–128d can be coupled to an electronic circuit arranged as a summing circuit, understood by one of ordinary skill in the art, in order to achieve certain advantages. The summing circuit, for example, can include two of the summing circuits 100 of FIG. 4. In one embodiment, the summing circuit can couple a first two of the Hall effect elements 128a–128d with a first summing circuit, such as the summing circuit 100 of FIG. 4, and a second two of the Hall effect elements 128a–128d with a second summing circuit, such as the summing circuit 100. With another amplifier, an output of the first summing circuit can be summed with an output of the second summing circuit. As an initial advantage, the four Hall effect elements 128a–128d, coupled to a summing circuit as described, in the presence of the current, provide a voltage output four times the magnitude of a voltage output from a single Hall effect element, for example the Hall effect element 18 of FIG. 1, in the presence of the same current. Therefore, the current sensor 120 has four times the sensitivity of the current sensor 10 of FIG. 1.

As a second advantage, the current sensor 120 is relatively insensitive to variation in the position of the Hall effect elements 128a–128d in the direction of the y-axis 142. This is because, when moved in the direction of the y-axis 142, the voltage output from two of the four Hall effect elements 128a–128d tends to increase while the voltage output from the other two of the four Hall effect elements 128a–128d tends to decrease. Therefore, when coupled as a summing circuit, the circuit output is relatively invariant to the y-axis position of the Hall effect elements.

Figure 6:
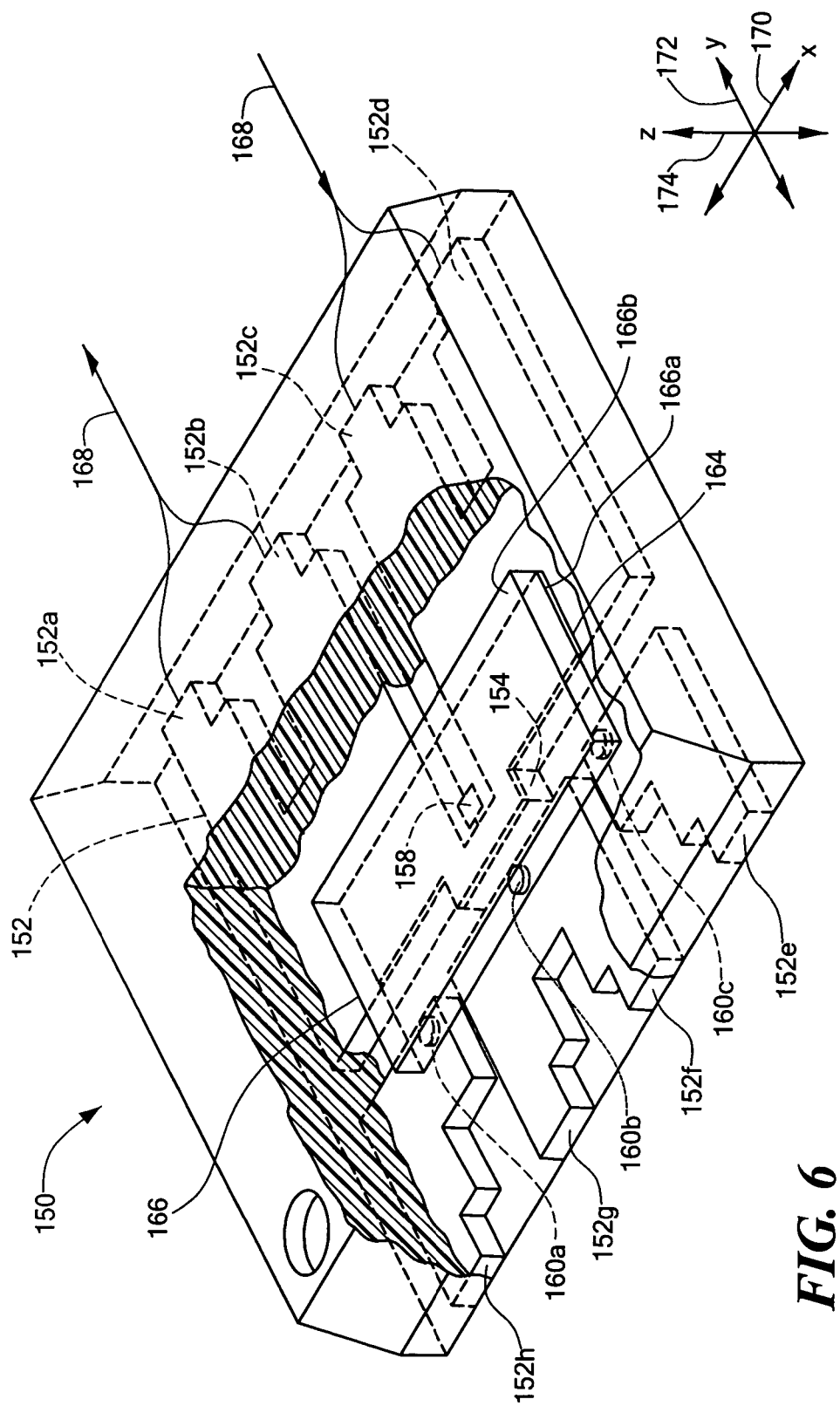
FIG. 6 is an isometric view of still another embodiment of a current sensor in accordance with the present invention.

Referring now to FIG. 6, an exemplary current sensor 150 in accordance with the present invention includes a lead frame 152 having a plurality of leads 152a–152h and a current conductor portion 154. The current sensor 150 also includes a substrate 166 having a first surface 166a and a second, opposing surface 166b. The substrate 166 has a Hall effect element 158 diffused into the first surface 166a, or otherwise disposed on the first surface 166a. The substrate 166 is disposed on the lead frame 152 so that the Hall effect element 158 is in close proximity to the current conductor portion 154. The substrate 166 has an orientation that is upside down (i.e., the first surface 166a is directed downward) in relation to the conventional orientation with which a substrate is mounted into an integrated circuit package. The substrate 166 is a flip-chip having solder balls 160a–160c on the first surface 166a of the substrate 166. The solder balls 160a–160c couple directly to the leads 152e–152h as shown. An insulator 164 separates the substrate 166 from the lead frame 152. The insulator 164 can be the same as or similar to the insulator 24 shown in FIG. 1.

With this arrangement, the Hall effect element 158 is disposed in close proximity to the current conductor portion 154 and at a predetermined position relative to the conductor portion 154, such that a magnetic field generated by an electrical current passing though the current conductor portion 154 in a direction shown by arrows 168, is in a direction substantially aligned with a maximum response axis of the Hall effect element 158. The Hall effect element 158 has a maximum response axis aligned with a z-axis 174. Therefore, the Hall effect element 158 is disposed just to the side (i.e., slight offset along a y-axis 172) of the current conductor portion 14, as shown, where the magnetic field is pointed along the z-axis 174. However, a Hall effect element, or another type of magnetic field sensor, for example a magnetoresistance element, having a maximum response axis aligned in another direction, can be disposed at another position relative to the current conductor portion 154, for example, on top (in a direction of the z-axis 174) of the current conductor portion 154.

Operation of the current sensor 150 is like the above-described operation of the current sensor 10 of FIG. 1. The Hall effect element 158, being is close proximity to the current conductor portion 154, results in a greater output voltage from the Hall effect element 158, and therefore an improved sensitivity.

While only one Hall effect element 158 is shown on the first surface 166a of the substrate 166, it will be appreciated that more than one Hall effect element can be used with this invention. Other circuitry, for example an amplifier, can also be diffused in or otherwise coupled to or supported by the first and/or second surfaces 166a, 166b of the substrate 166.

While three solder balls 160a–160c are shown, any number of solder balls can be provided, including dummy solder balls for stabilizing the substrate 166. Also, while solder balls 160a–160c are shown, other connection methods can also be used, including, but not limited to gold bumps, eutectic and high lead solder bumps, no-lead solder bumps, gold stud bumps, polymeric conductive bumps, anisotropic conductive paste, and conductive film.

Figure 6A:
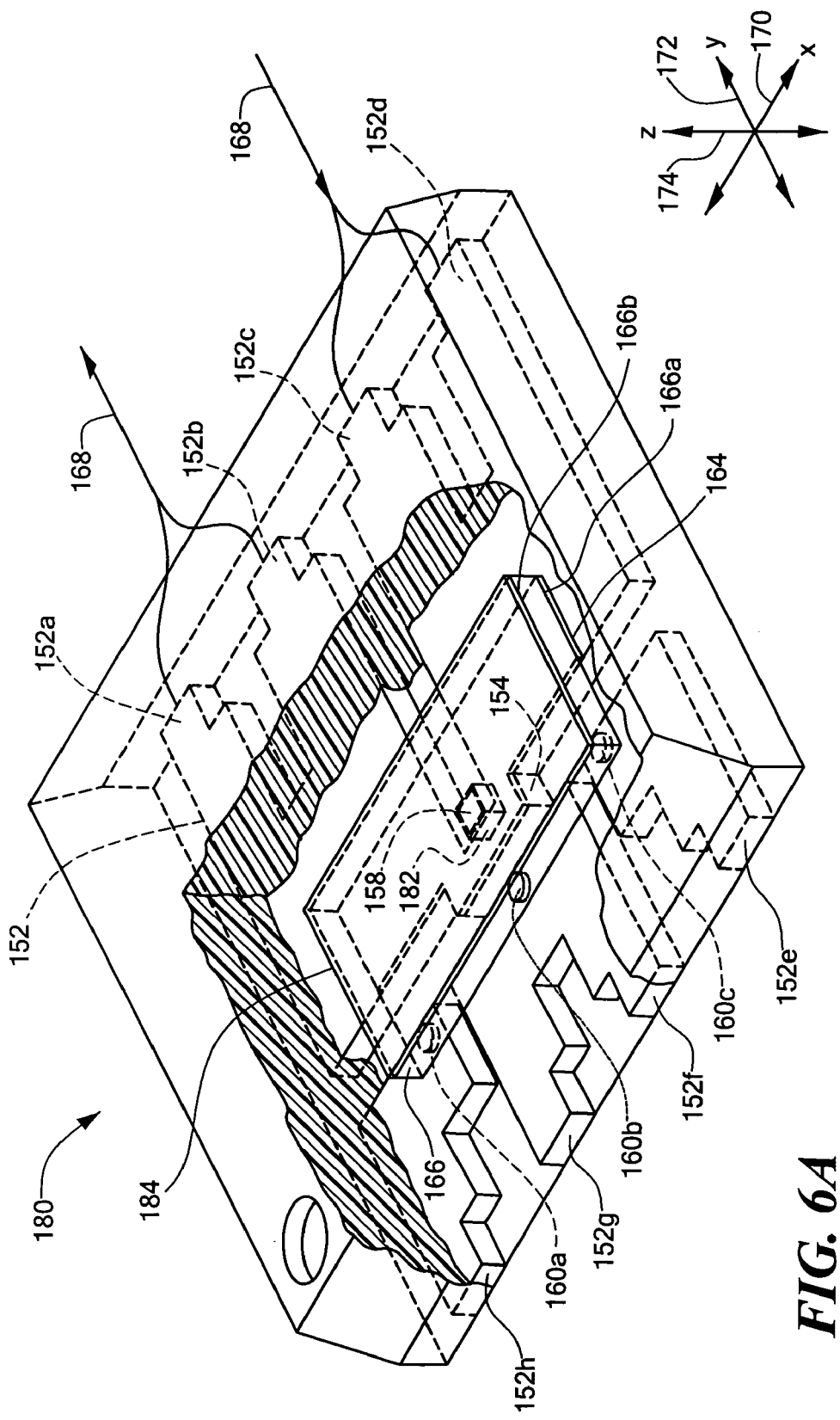
FIG. 6A is an isometric view of still another embodiment of a current sensor in accordance with the present invention.

Referring now to FIG. 6A, in which like elements of FIG. 6 are shown having like reference designations, an exemplary current sensor 180 in accordance with the present invention includes a flux concentrator 182 and a flux concentrating layer 184. The flux concentrator is located proximate the Hall effect sensor 158, adjacent to and below the first surface 166a of the substrate 166. The flux concentrating layer 184 is disposed on (or adjacent to and above) the second surface 166b of the substrate 166.

In operation, the flux concentrator 182 and the flux concentrating layer 184 each tend to concentrate the magnetic flux generated by the current passing through the current conductor portion 154 so as to cause the current sensor 180 to have a higher sensitivity than the current sensor 150 of FIG. 6.

The flux concentrator 182 and the flux concentrating layer 184 can each be comprised of a variety of materials, including but not limited to, ferrite, Permalloy, and iron.

While the flux concentrator 182 is shown having a cubic shape, in other embodiments, the flux concentrator can have another shape, for example, a polyhedral shape, an elliptical shape, or a spherical shape. While both the flux concentrator 182 and the flux concentrating layer 184 are shown, in other embodiments, only one of the flux concentrator 182 and the flux concentrating layer 184 can be provided. Also, while the flux concentrator 182 and the flux concentrating layer 184 are shown in conjunction with one magnetic field transducer 158, it should be appreciated that the flux concentrator 182 and the flux concentrating layer 184 can also be applied to configurations having more than the one magnetic field transducer 158, for example, the configurations shown in FIGS. 1, 3, and 5.

Referring now to FIG. 7, another exemplary current sensor 200 in accordance with the present invention includes a lead frame 202 having a plurality of leads 202a–202h. The current sensor 200 also includes a substrate 206 having a first surface 206a and a second, opposing surface 206b. The substrate 206 has a Hall effect element 208 diffused into the first surface 206a, or otherwise disposed on the first surface 206a. A conductive clip 204 having a current conductor portion 204a is coupled to the leads 202a–202d. Features of the conductive clip 204 are shown in FIG. 8. Suffice it to say here that the conductive clip is formed having a bend such that the conductive clip 204 passes up and over the first surface 206a of the substrate 206. The substrate 206 is disposed on the lead frame 202 so that the Hall effect element 208 is in close proximity to the current conductor portion 204a. In the illustrated embodiment, the substrate 206 has a conventional mounting orientation with the first surface 206a directed upward. The substrate 206 has bonding pads 212a–212c on the first surface 206a, to which bond wires 210a–210c are coupled. The bond wires 210a–210c are further coupled to the leads 202e, 202f, 202h. An insulator 214 can be provided to isolate the substrate 206 from the conductive clip 204. The insulator 214 can be the same as or similar to the insulator 24 shown in FIG. 1.

With this arrangement, the Hall effect element 208 is disposed in close proximity to the current conductor portion 204a, which passes up and over the first surface 206a of the substrate 206. The Hall effect element 208 is disposed at a predetermined position relative to the conductor portion 204a such that a magnetic field generated by an electrical current passing though the current conductor portion 204a in a direction shown by arrows 216, is in a direction substantially aligned with a maximum response axis of the Hall effect element 208. The Hall effect element 208 has a maximum response axis aligned with a z-axis 224. In the illustrated embodiment, the Hall effect element 208 is disposed just to the side (i.e., slight offset along a y-axis 222) of the current conductor portion 204a, as shown, where the magnetic field is pointed along the z-axis 224. However, a Hall effect element, or another type of magnetic field sensor, for example a magnetoresistance element, having a maximum response axis aligned in another direction, can be disposed at another position relative to the current conductor portion 204a, for example, essentially aligned above or below (in a direction of the z-axis 224) with the current conductor portion 204a.

In operation, current flows into the leads 202c, 202d, which are coupled in parallel, through the conductive clip 204, through the current conductor portion 204a, and out of the leads 202a, 202b, which are also coupled in parallel. The current flowing though the current conductor portion 204a generates a magnetic field, which is sensed by the Hall effect element 208. The Hall effect element 208 generates a voltage output proportional to the magnetic field and therefore proportional to the current flowing though the current conductor portion 204a. As described above, the Hall effect element 208 is in very close proximity to the current conductor portion 204a and at a predetermined position relative to the current conductor portion 204a in which the magnetic field generated by the current is substantially aligned with the maximum response axis of the Hall effect element 208. This position results in a greater voltage output from the Hall effect element 208, and therefore improved sensitivity.

While only one Hall effect element 208 is shown on the second surface 206b of the substrate 206, it will be appreciated that more than one Hall effect element can be used. In particular, an embodiment having two Hall effect elements can be similar to the current sensor 70 of FIG. 3 and an embodiment having four Hall effect elements can be similar to the current sensor 120 of FIG. 5. Also, additional circuitry, for example an amplifier, can be diffused in or otherwise coupled to the first and/or second surfaces 206a, 206b of the substrate 206.

It should be appreciated that the conductive clip 204 can be formed in a variety of ways and from a variety of materials. In one particular embodiment, the conductive clip 204 is stamped, for example, from a copper sheet. In another embodiment, the conductive clip 204 is formed from foil, for example copper foil. In yet another embodiment, the conductive clip 204 is formed by an etching process. The conductive clip 204 allows the use of the conventional mounting orientation of the substrate 206 while bringing the current conductor portion 204a very close to the Hall effect element 208.

The conductive clip 204 can be provided having a thickness selected in accordance with an amount of current that will pass through the conductive clip 204. Therefore, if a current sensor adapted to sense relatively high currents is desired, the conductive clip can be relatively thick, whereas, if a current sensor adapted to sense relatively low currents is desired, the conductive clip 204 can be relatively thin. In another embodiment, if a current sensor adapted to sense relatively high currents is desired, more than one conductive clip 204 can be stacked in contact with other conductive clips to provide an increased effective thickness that is thicker than any one conductive clip 204, and therefore, able to carry more current.

In the embodiment of FIG. 7, the close proximity between the Hall effect element 208 and the current conductor portion 204a is achieved by providing the Hall effect element 208 on the first substrate surface 206a, which is positioned closer to the current conductor portion 204a than the second surface 206b. In other embodiments, this advantageous close proximity is achieved by providing the Hall effect element 208 on the second substrate surface 206b and forming the current conductor portion 204a so as to be in substantial alignment with the second surface 206b.

Referring now to FIG. 8, in which like elements of FIG. 7 are shown having like reference designations, the conductive clip 204 is shown before it is coupled to the leads 202a–202d. The conductive clip 204 includes the current conductor portion 204a, a transition region 204b, a bend region 204c, and a bonding region 204d. The bonding region 204d includes two portions 204e, 204f which couple to the leads 202a–202d. The transition region 204b can be elevated relative to the current conductor portion 204a to avoid contact with the substrate 206.

While Hall effect elements have been shown and described in association with embodiments of this invention, it will be recognized that other types of magnetic field sensors can be used. For example, magnetoresistance elements can be used in place of the Hall effect elements. However, a conventional magnetoresistance element has a maximum response axis that is perpendicular to the maximum response axis of a conventional Hall effect element. One of ordinary skill in the art will understand how to position one or more magnetoresistance elements relative to a current conductor portion in accordance with embodiments of the present invention to achieve the same results as the Hall effect element embodiments herein described.

Figure 9:
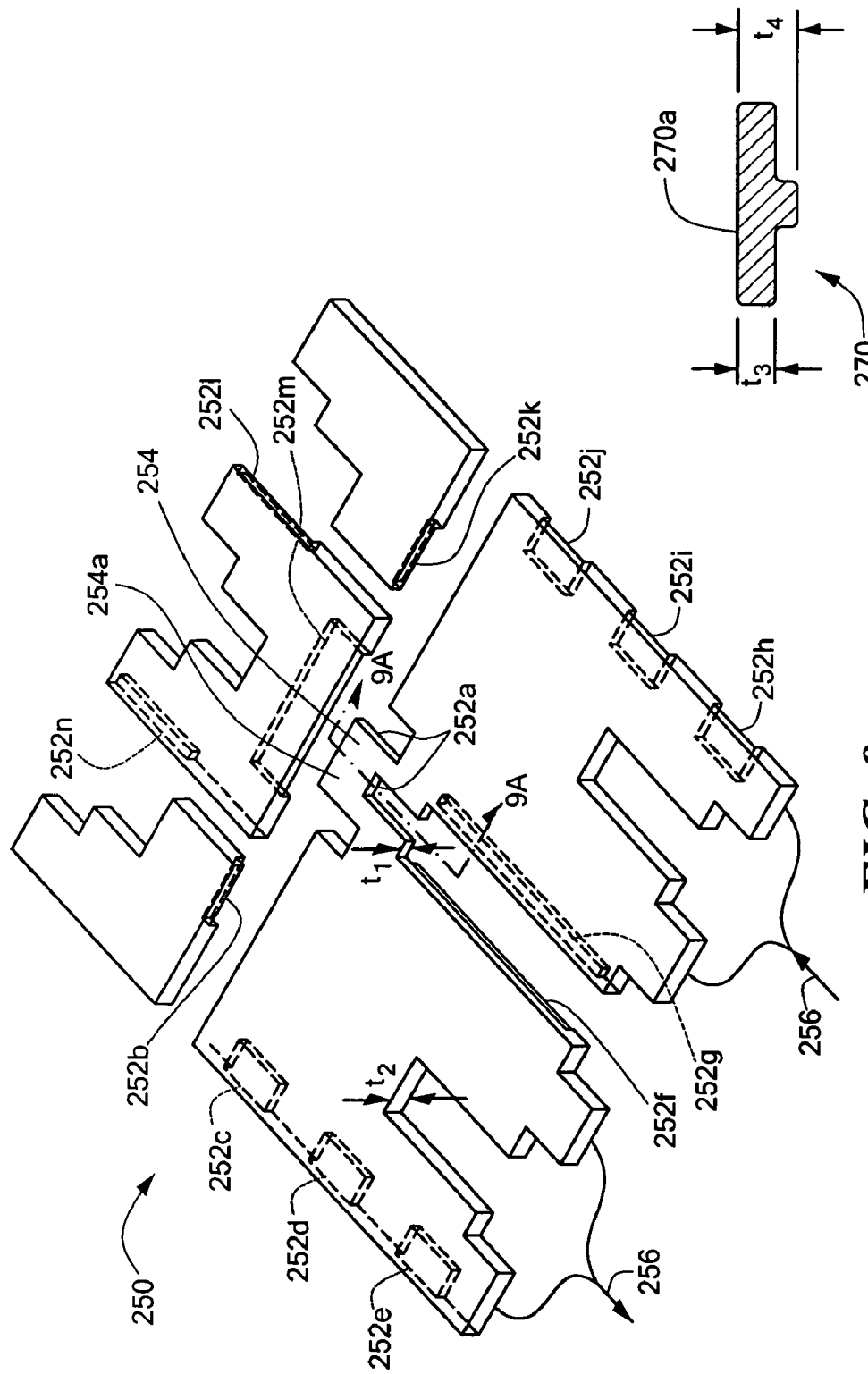
FIG. 9 is an isometric view of an alternate lead frame having a thinner current conductor portion according to a further aspect of the invention.

Referring now to FIG. 9, a lead frame 250 is shown having a shape similar to the lead frame 72 of FIG. 3 and the lead frame 152 of FIG. 6. The lead frame 250 has a plurality of thinned portions 252a–252n that are thinner than other portions of the lead frame 250. The thinner portions can be provided by a variety of processes, including, but not limited to, chemical etching and stamping.

A current conductor portion 254 has a surface 254a and a thickness t1 which can be the same as or similar to the thickness of others of the thinned portion 252b–252n. Other portions of the lead frame have a thickness t2. In one particular embodiment, the thickness t1 of the current carrying portion 254 is the same as the thickness of the other thinned portions 252b–252n, and the thickness t1 is approximately half of the thickness t2. In one embodiment, the current conductor portion 254 has a cross section that is essentially rectangular, having the thickness t1.

It will be recognized that, in the presence of a current passing through the current conductor portion 254, the current conductor portion 254 being thinner, for example, than the current conductor portion 74 of FIG. 3, has a higher current density near the surface 254a than the current conductor portion 74 of FIG. 3 has near the surface 74a in the presence of a similar current. In other words, the current is compressed to be closer to the surface 254a than it would otherwise be with a thicker current conductor portion. As a result, a magnetic field generated by the current has a higher flux density in proximity to the surface 254a.

Therefore, when the lead frame 250 is used in place of the lead frame 72 of FIG. 3, the Hall effect elements 78a, 78b experience a greater magnetic field, resulting in a more sensitive current sensor.

Others of the thinned portion 252b–252n provide other advantages. For example, when the lead frame 250 is molded into a plastic surrounding body, the other thinned portions 252b–252n tend to lock the lead frame 250 more rigidly into the molded body.

The thickness t1 is selected in accordance with a variety of factors, including, but not limited to, a maximum current to be passed through the current conductor portion 254.

It will be understood that thinned portions can be applied to others of the lead frames shown above in embodiments other than the embodiment of FIG. 3 in order to achieve the same advantages.

Referring now to FIG. 9A, an alternate current conductor portion 270, suitable for replacing the current conductor portion 254 of FIG. 9, has a T-shaped cross section as would be seen from a cross-section taken along line 9A—9A of FIG. 9. The T-shape has a surface 270a, a first thickness t3, and a second thickness t4. The thickness t3 can be the same as or similar to the thickness t1 of FIG. 9, and the thickness t4 can be the same as or similar to the thickness t2 of FIG. 9. In one particular embodiment the thickness t3 is approximately half of the thickness t4.

For substantially the same reasons describe above in conjunction with FIG. 9, a magnetic field generated in response to a current passing through the current conductor portion 270 is higher in proximity to the surface 270a than it would be if the current conductor portion 270 had a uniform thickness t4.

While the current conductor portion 254 (FIG. 9) and the current conductor portion 270 have been described to have a rectangular cross section and a T-shaped cross section respectively, it should be appreciated that other cross-sectional shapes can be provided to achieve the above advantages.

Figure 10:
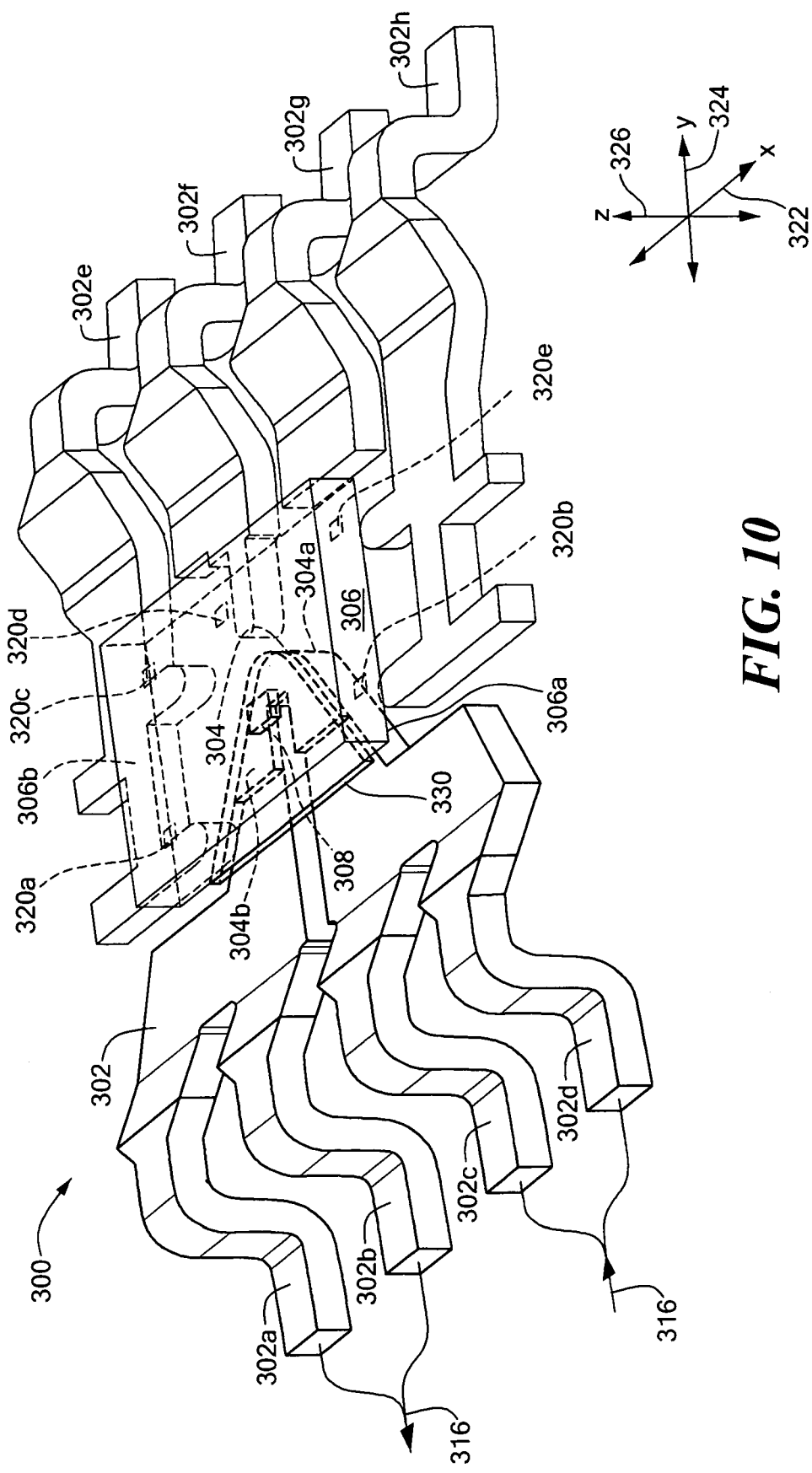
FIG. 10 is an isometric view of still another embodiment of a current sensor in accordance with the present invention.

Referring now to FIG. 10, another exemplary current sensor 300 in accordance with the present invention includes a lead frame 302 (also referred to herein as a lead frame portion) having a plurality of leads 302a–302h and a current conductor portion 304 provided as a combination of a first current conductor portion 304a and a second current conductor portion 304b. The current sensor 300 also includes a substrate 306 having a first surface 306a and a second, opposing, surface 306b. The substrate 306 has a Hall effect element 308 diffused into the first surface 306a, or otherwise disposed on or supported by the first surface 306a. The substrate 306 is disposed on the lead frame 302 so that the Hall effect element 308 is in close proximity to the current conductor portion 304. In the illustrated embodiment, the substrate 306 has an orientation that is upside down (i.e., the first surface 306a is directed downward) in relation to the conventional orientation of a substrate mounted in an integrated circuit package. The substrate 306 is a flip-chip having solder balls 320a–320e on the first surface 306a of the substrate 306. The solder balls 320a–320e couple directly to the leads 302e–302h. An insulating layer 330 can separate the substrate 306 from the lead frame 302. The insulating layer 330 can be the same as or similar to the insulator 24 shown in FIG. 1.

In one particular embodiment, the second current conductor portion 304b is deposited directly on the first surface 306a of the substrate 306 and no insulating layer 330 is used. The second current conductor portion 304b can be deposited by any conventional integrated circuit deposition technique, including, but not limited to, sputtering and electroplating. In other embodiments, the second current conductor portion 304b is a conductive structure separate from but proximate to the first surface 306a of the substrate 306, and the insulating layer 330 is disposed between the second current conductor portion 304b and the first surface 306a of the substrate 306.

It should be recognized that the Hall effect element 308, the insulating layer 330, the second current conductor portion 304b, and the first current conductor portion are under the substrate 306 as shown.

With these arrangements, the Hall effect element 308 is disposed in close proximity to the current conductor portion 304 and at a predetermined position relative to the current conductor portion 304 such that a magnetic field generated by an electrical current 316 passing though the current conductor portion 304 is in a direction substantially aligned with a maximum response axis of the Hall effect element 308. Here, the Hall effect element 308 has a maximum response axis aligned with a z-axis 326. Therefore, the Hall effect element 308 is disposed to a side (i.e., slightly offset along a y-axis 324) of the current conductor portion 304, as shown, where the magnetic field is pointed along the z-axis 326. However, a Hall effect element, or another type of magnetic field sensor, for example, a magnetoresistance element, having a maximum response axis aligned in another direction, can be disposed at another position relative to the current conductor portion 304, for example, on top (in a direction of the z-axis 326) of the current conductor portion 304.

The insulating layer 330 can be an interposing insulating layer or a substrate insulating layer associated with the substrate 306. In some embodiments for which the insulating layer 330 is an interposing insulating layer, the insulating layer 330 is a ceramic interposing insulating layer.

In some embodiments for which the insulating layer 330 is a substrate insulating layer associated with the substrate 306, the insulating layer 330 is a substrate taped insulating layer formed with a taping process. The substrate taped insulating layer can be comprised of a tape applied to the substrate, including but not limited to, a polymer tape, for example a Kapton® tape.

In still other embodiments for which the insulating layer 330 is a substrate insulating layer associated with the substrate 306, the insulating layer 330 is a substrate deposited insulating layer formed with a deposition process. The deposition process used to form the insulating layer 330 can include a variety of processes, including, but not limited to, a screen printing process, a spin depositing process, a sputtering process, a plasma enhanced chemical vapor deposition (PECVD) process, and a low-pressure chemical vapor deposition (LPCVD) process. The screen printing process can result in a substrate insulating layer comprised of a variety materials, including but not limited to, polymer or ceramic materials. The spin depositing process can result in a substrate insulting layer comprised of a variety materials, including but not limited to a polymer, for example, polyimide (e.g., trade name Pyralin®) or bisbenzocyclobutene (BCB) (e.g., trade name Cyclotene®). The sputtering process can result in a substrate insulting layer comprised of a variety materials, including but not limited to, nitride or oxide. The PECVD process can result in a substrate insulting layer comprised of a variety materials, including but not limited to, nitride or oxide. The LPCVD process can result in a substrate insulting layer comprised of a variety materials, including but not limited to, nitride or oxide.

In still other embodiments for which the insulating layer 330 is a substrate insulating layer associated with the substrate 306, the insulating layer 330 is a substrate oxide insulating layer formed with an oxide generation process. The substrate oxide insulating layer can be comprised, for example, of a silicon dioxide.

In operation, the current 316 flows into the leads 302c, 302d, which are coupled in parallel, through the current conductor portion 304, and out of the leads 302a, 302b, which are also coupled in parallel. The current flowing though the current conductor portion 304 generates a magnetic field, which is sensed by the Hall effect element 308. As described above, the Hall effect element 308 is in very close proximity to the current conductor portion 304 and at a predetermined position relative to the current conductor portion 304 at which the magnetic field generated by the current is substantially aligned with the maximum response axis of the Hall effect element 308. This placement results in a greater voltage output from the Hall effect element 308, and therefore greater sensitivity.

With this arrangement, it will be appreciated that the current 316 flowing through the current conductor portion 304 splits between the first and second current conductor portions 304a, 304b, respectively.

While the lead frame 302 is shown to have the bent leads 302a–302h suitable for surface mounting to a circuit board, it will be appreciated that a lead frame having leads with other shapes can also be used, including but not limited to, through hole leads having a straight shape.

While only one Hall effect element 308 is shown on the first surface 306a of the substrate 306, it will be appreciated that more than one Hall effect element can be used with this invention. Other circuitry, for example an amplifier, can also be diffused in or otherwise coupled to or supported by the first and/or second surfaces 306a, 306b of the substrate 306.

While five solder balls 320a–320e are shown, any number of solder balls can be provided, including dummy solder balls for stabilizing the substrate 306. Also, while solder balls 320a–320e are shown, other connection methods can also be used, including, but not limited to gold bumps, eutectic and high lead solder bumps, no-lead solder bumps, gold stud bumps, polymeric conductive bumps, anisotropic conductive paste, conductive film, and wire bonds.

While the substrate is 306 is shown in a flip-chip arrangement, in other embodiments, the substrate 306 can be conventionally mounted such that the first surface 306a is above the second surface 306b when the integrated circuit 300 is mounted to an uppermost surface of a circuit board.

With these arrangements, the first and second current conductor portions 304a, 304b, respectively, are each above the first surface 306a of the substrate 306.

Figure 11:
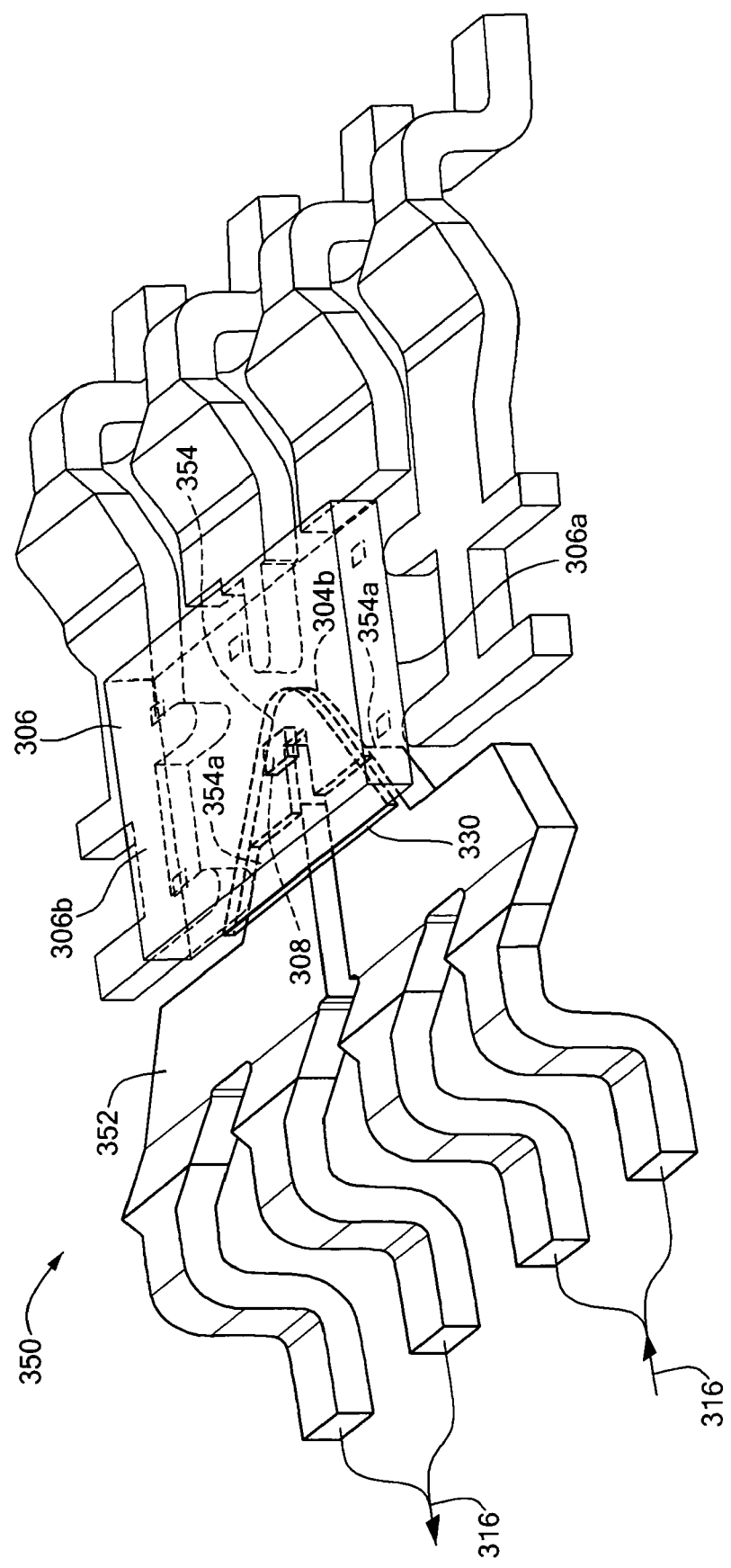
FIG. 11 is an isometric view of an alternate arrangement of the current sensor of FIG. 10.

Referring now to FIG. 11, in which like elements of FIG. 10 are shown having like reference designations, a current sensor 350 differs from the current sensor 300 of FIG. 10 by providing a current conductor portion 354 different than the current conductor portion 304 of FIG. 10. The current conductor portion 354 includes a first current conductor portion 354a and the second current conductor portion 304b. A lead frame 352 having the first current conductor portion 354a does not form a continuous current path, unlike the lead frame 302 having the first current conductor portion 304a of FIG. 10. With this arrangement, it will be appreciated that all of the current 316 flowing through the current conductor portion 354 passes through the second current conductor portions 304b. Therefore, the current 316 passes closer to the Hall effect element 308 than in the current sensor 300 of FIG. 10, resulting in a higher sensitivity.

As described above in conjunction with FIG. 10, while the substrate 306 is shown in a flip-chip arrangement, in other embodiments, the substrate 306 can be conventionally mounted such that the first surface 306a is above the second surface 306b when the integrated circuit 300 is mounted to an uppermost surface of a circuit board. With these arrangements, the first and second current conductor portions 354a, 304b, respectively, are each above the first surface 306a of the substrate 306.

Figure 12:
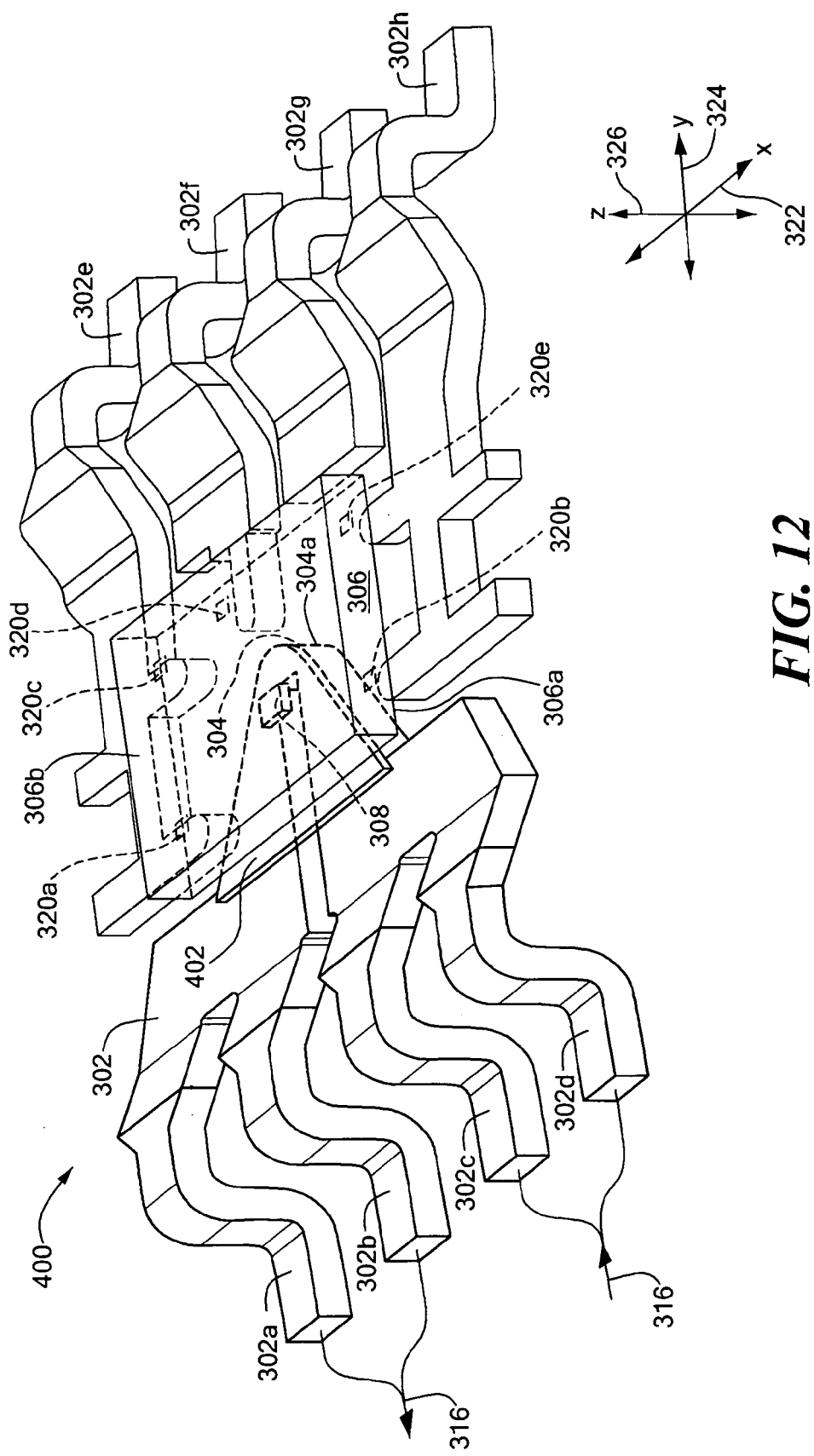
FIG. 12 is an isometric view of another alternate arrangement of the current sensor of FIG. 10.

Referring now to FIG. 12, in which like elements of FIG. 10 are shown having like reference designations, a current sensor 400 differs from the current sensor 300 of FIG. 10 by providing a current conductor portion 304 having only the current conductor portion 304a (i.e., there is no current conductor portion 304b, FIG. 10). The lead frame 302 having the first current conductor portion 304a forms a continuous current path. With this arrangement, it will be appreciated that all of the current 316 passes through the current conductor portion 304a.

An insulating layer 402 is disposed between the current conductor portion 304a and the first surface 306a of the substrate 306. In some embodiments, the insulating layer 402 is an interposing insulating layer, for example a ceramic layer as described above in conjunction with FIG. 10. In other embodiments, the insulating layer 402 is a substrate insulating layer associated with the substrate. In other embodiments, the insulating layer 402 is a lead frame insulating layer associated with the lead frame 302. It will be appreciated that, when associated with the lead frame, the insulating layer 402 can extend beyond the substrate 306 in a direction along the y-axis 324. This arrangement provides enhanced reliability, since an edge of the substrate 306 is less likely to contact the lead frame 302.

Interposing insulating layers and substrate insulating layers are described above, in conjunction with FIG. 10.

In some embodiments for which the insulating layer 402 is a lead frame insulating layer associated with the lead frame 302, the insulating layer 402 is a lead frame taped insulating layer formed with a taping process. The lead frame taped insulating layer can be comprised of a tape applied to the lead frame, including but not limited to, a polymer tape, for example, a Kapton® tape.

In other embodiments for which the insulating layer 402 is a lead frame insulating layer associated with the lead frame 302, the insulating layer 402 is a lead frame sprayed insulating layer formed with a spraying process. The lead frame sprayed insulting layer can be comprised of a variety of materials, including but not limited to a polymer, for example, a polyimide (e.g., trade name Pyralin®), a bisbenzocyclobutene (BCB) (e.g., trade name Cyclotene®) a sprayed dielectric, (e.g., trade names 3M Scotch® Insulating Spray 1601 and Loctite® ShadowCure® 3900), or a spray ceramic coating.

In other embodiments for which the insulating layer 402 is a lead frame insulating layer associated with the lead frame 302, the insulating layer 402 is a lead frame deposited insulating layer formed with a deposition process. The lead frame deposited insulating layer can be formed with a variety of processes, including, but not limited to a screen printing process The screen printing process can result in a lead frame deposited insulting layer comprised of a variety of materials, including but not limited to, polymers or ceramics. In still other embodiments, the lead frame deposited insulating layer is formed with a vacuum deposition process. For these embodiments, the lead frame deposited insulating layer can be comprised, for example, of a polymer, for example, parylene.

In still other embodiments for which the insulating layer 402 is a lead frame insulating layer associated with the lead frame 302, the insulating layer 402 is a lead frame oxide insulating layer formed with an oxide generation process. The lead frame oxide insulating layer can be comprised, for example, of a sputtered oxide layer disposed onto the lead frame 302.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims. All references cited herein are hereby incorporated herein by reference in their entirety.

What is claimed is:

1. A method of manufacturing an integrated circuit, comprising:
providing a substrate having first and second opposing surfaces;
providing a magnetic field sensing element on the first surface of the substrate;
mounting the substrate proximate to a lead frame, wherein at least a portion of the lead frame is substantially parallel to the first surface of the substrate and proximate to the magnetic field sensing element, wherein the lead frame has a plurality of leads and the portion of the lead frame proximate to the magnetic field sensing element comprises a current conductor portion including a coupling of at least two of the plurality of leads, wherein each one of the leads has a respective length, and wherein each one of the leads has a bend in a direction selected to result in each one of the leads being closer to the first surface of the substrate than to the second surface of the substrate throughout the length of the lead; and
providing an insulating layer disposed between and proximate to the substrate and the portion of the lead frame, wherein the providing an insulating layer includes at least one of providing an interposing insulating layer, providing a lead frame insulating layer associated with the lead frame, or providing a substrate insulating layer associated with the substrate.

2. The method of claim 1, wherein the interposing insulating layer comprises a ceramic layer.

3. The method of claim 1, wherein the providing a lead frame insulting layer associated with the lead frame comprises at least one of:

taping the insulating layer onto the lead frame to provide a lead frame taped insulating layer, spraying the insulating layer onto the lead frame to provide a lead frame sprayed insulating layer, depositing the insulating layer onto the lead frame to provide a lead frame deposited insulating layer, or forming an oxide layer on the lead frame to provide a lead frame oxide insulting layer.

4. The method of claim 3, wherein the lead frame taped insulating layer comprises a polymer tape.

5. The method of claim 3, wherein the lead frame sprayed insulating layer comprises a polymer.

6. The method of claim 3, wherein the lead frame deposited insulating layer comprises at least one of a polymer or a ceramic.

7. The method of claim 1, wherein the providing a substrate insulting layer associated with the substrate comprises at least one of:

taping the insulating layer onto the substrate to provide a substrate taped insulating layer, depositing the insulating layer onto the substrate to provide a substrate deposited insulating layer, or forming an oxide layer on the substrate to provide a substrate oxide insulting layer.

8. The method of claim 7, wherein the substrate taped insulating layer comprises a polymer tape.

9. The method of claim 7, wherein the depositing the insulating layer onto the substrate comprises at least one of screen printing the insulating layer, spin depositing the insulating layer, sputtering the insulating layer, plasma enhanced chemical vapor depositing the insulating layer, or low-pressure chemical vapor depositing the insulating layer.

10. The method of claim 7, wherein the substrate deposited insulating layer comprises at least one of a polymer, a ceramic, an oxide, or a nitride.

11. The method of claim 7, wherein the substrate oxide insulating layer comprises silicon dioxide.

12. An integrated circuit, comprising:

a lead frame having a plurality of leads and having a current conductor portion comprising at least two of the plurality of leads;

a substrate having first and second opposing surfaces, the first surface proximate to said current conductor portion and the second surface distal from said current conductor portion, wherein each one of the leads has a respective length, and wherein each one of the leads has a bend in a direction selected to result in each one of the leads being closer to the first surface of the substrate than to the second surface of the substrate throughout the length of the lead;

an insulating layer disposed between the substrate and the current conductor portion of the lead frame; and one or more magnetic field transducers disposed on the first surface of said substrate.

13. The integrated circuit of claim 12, wherein the insulating layer comprises polymer tape.

14. The integrated circuit of claim 12, wherein the insulating layer comprises a ceramic layer.

15. The integrated circuit of claim 12, wherein the insulating layer comprises an insulating material disposed on the current conductor portion.

16. The integrated circuit of claim 15, wherein the insulating material comprises at least one of a polymer tape, a polymer, a ceramic, or an oxide.

17. The integrated circuit of claim 12, wherein the insulating layer comprises an insulating material disposed on the substrate.

18. The integrated circuit of claim 17, wherein the insulating material comprises at least one of a polymer tape, a polymer, a ceramic, a nitride, or an oxide.

19. The integrated circuit of claim 12, wherein the current conductor portion comprises a coupling of the at least two of the plurality of leads.

20. An integrated circuit, comprising:

a lead frame portion having a plurality of leads and having a first current conductor portion comprising at least two of the plurality of leads;

a substrate having first and second opposing surfaces, the first surface proximate to said first current conductor portion and the second surface distal from said first current conductor portion;

one or more magnetic field transducers disposed on the first surface of said substrate;

a second current conductor portion deposited proximate to the first surface of the substrate, disposed proximate to the one or more magnetic field transducers, and coupled to the first current conductor portion; and an insulating layer disposed between the second current conductor portion and the first surface of the substrate.

21. The integrated circuit of claim 20, wherein the insulating layer comprises polymer tape.

22. The integrated circuit of claim 20, wherein the insulating layer comprises a ceramic layer.

23. The integrated circuit of claim 20, wherein the insulating layer comprises an insulating material disposed on the lead frame.

24. The integrated circuit of claim 23, wherein the insulating material comprises at least one of a polymer tape, a polymer, a ceramic, or an oxide.

25. The integrated circuit of claim 20, wherein the insulating layer comprises an insulating material disposed on the first surface of the substrate.

26. The integrated circuit of claim 25, wherein the insulating material comprises at least one of a polymer tape, a polymer, a ceramic, a nitride, or an oxide.

27. The integrated circuit of claim 25, wherein a material of the insulating layer comprises at least one of a polymer, a ceramic, a nitride, or an oxide.

28. The integrated circuit of claim 20, wherein the current conductor portion comprises a coupling of the at least two of the plurality of leads.

29. An integrated circuit, comprising:

a lead frame having a plurality of leads and having a current conductor portion comprising at least two of the plurality of leads, wherein the current conductor portion forms a loop;

a substrate having first and second opposing surfaces, the first surface proximate to said current conductor portion and the second surface distal from said current conductor portion;

one or more magnetic field transducers disposed on the first surface of said substrate proximate to the loop; and an insulating layer disposed between the substrate and the current conductor portion of the lead frame, wherein the insulating layer comprises at least one of:

an interposing insulating layer comprising a ceramic layer, a lead frame insulating layer associated with the lead frame and comprising at least one of a lead frame sprayed insulating layer, a lead frame deposited insulating layer, a lead frame taped insulating layer or a lead frame oxide insulating layer, or a substrate insulating layer associated with the substrate and comprising at least one of a substrate deposited insulating layer, a substrate taped insulating layer, or a substrate oxide insulating layer; and a second current conductor portion deposited proximate to the first surface of the substrate, disposed proximate to the one or more magnetic field transducers, and coupled to the current conductor portion.

* * * * *

UNITED STATES PATENT AND TRADEMARK OFFICE
CERTIFICATE OF CORRECTION

PATENT NO. : 7,166,807 B2
APPLICATION NO. : 11/144970
DATED : January 23, 2007
INVENTOR(S) : Jay Gagnon et al.

It is certified that error appears in the above-identified patent and that said Letters Patent is hereby corrected as shown below:

Column 2, line 3 delete "invention a method" and replace with --invention, a method--.

Column 2, line 39 delete "invention an integrated" and replace with --invention, an integrated--.

Column 4, line 16 delete "passing though" and replace with --passing through--.

Column 5, line 66 delete "passing though" and replace with --passing through--.

Column 6, line 21 delete "flowing though" and replace with --flowing through--.

Column 7, line 6 delete "fields 112a, 112b the Hall" and replace with --fields 112a, 112b, the Hall--.

Column 7, line 29 delete "though vias" and replace with --through vias--.

Column 7, line 38 delete "element 128a, 128b" and replace with --elements 128a, 128b--.

Column 7, line 52 delete "passing though" and replace with --passing through--.

Column 8, line 61 delete "passing though" and replace with --passing through--.

Column 9, line 11 delete "being is close" and replace with --being in close--.

Signed and Sealed this

Twenty-sixth Day of June, 2007

JON W. DUDAS
*Director of the United States Patent and Trademark Office*